United States Patent [19]

Shimanek et al.

[11] Patent Number: 5,889,412
[45] Date of Patent: *Mar. 30, 1999

[54] CONDENSED SINGLE BLOCK PLA PLUS PAL ARCHITECTURE

[75] Inventors: Schuyler E. Shimanek; Thomas J. Davies, both of Albuquerque, N. Mex.

[73] Assignee: Philips Electronics North America Corporation, New York, N.Y.

[ * ] Notice: The term of this patent shall not extend beyond the expiration date of Pat. No. 5,684,413.

[21] Appl. No.: 879,917

[22] Filed: Jun. 20, 1997

Related U.S. Application Data

[62] Division of Ser. No. 623,622, Mar. 8, 1996, Pat. No. 5,684,413.

[51] Int. Cl.$^6$ .................................................. H03K 19/177
[52] U.S. Cl. .................................................. 326/39; 326/41
[58] Field of Search .................................. 326/37, 41, 44, 326/47

[56] References Cited

U.S. PATENT DOCUMENTS

| | | | |
|---|---|---|---|
| 4,140,967 | 2/1979 | Balsubramanian et al. | 326/41 |
| 4,506,341 | 3/1985 | Kalter et al. | 326/41 |
| 5,081,375 | 1/1992 | Pickett et al. | 326/41 |
| 5,309,046 | 5/1994 | Steele | 326/41 |
| 5,684,413 | 11/1997 | Shimanek et al. | 326/41 |

*Primary Examiner*—Jon Santamauro
*Assistant Examiner*—Don Phu Le
*Attorney, Agent, or Firm*—Brian J. Wieghaus

[57] ABSTRACT

A condensed single block PAL plus PLA architecture utilizing a rectangular shape is shown. By interleaving the ORterms of the PLA array with the Pterms of the PAL array, a significant amount of die space is saved when incorporating the circuit with silicon. The decode routing required is now simplified and the propagation delay skews through the array are also reduced.

14 Claims, 4 Drawing Sheets

CONDENSED SINGLE BLOCK PLA PLUS PAL ARCHITECTURE

This is a division of application Ser. No. 08/623,622, filed Mar. 28, 1996 now U.S. Pat. No. 5,684,413.

BACKGROUND OF THE INVENTION

1. Field of the Invention

The present invention relates to programmable logic array architectures. More particularly, it relates to a single block PAL plus PLA architecture.

2. The Prior Art

The basic building blocks of a programmable logic device (Pld) are the Product-term and the ORterm. Within each of these terms exists several programmable logic blocks (cells). When the outputs of several such cells are 'ANDed' the term is called a 'Product-term', and when outputs are "ORed' the term is called an 'ORterm'.

The construction of a programmable logic array requires the joining of two array blocks commonly known as a 'PAL' and 'PLA' array. The construction of the 'PAL' array is made by stacking several product-terms and 'ORing' sequential clusters of their outputs into a fixed width OR gate. The construction of the 'PLA' array is similar to that of the 'PAL' array except the output of each product-term functions as an input to an array of ORterms.

The basic PLD contains a single PAL array or PLA array, or one of each. When constructing complex PLDs (CPLDs), multiple blocks of PAL and PLA arrays are used. These array structures are generally L-shaped, and as such, prevent the efficient placement of multiple blocks of these arrays on silicon. Under this circumstance, not only is silicon die space wasted, but decode routing is more complicated, and propagation delays through the PLA become more skewed.

SUMMARY OF THE INVENTION

According to the invention, a rectangular shaped PAL plus PLA array is formed. The modified structure of the invention interleaves the ORterms within the PAL array. Therefore, rather than routing the outputs of the PLA array Product-terms to the right, they are routed vertically through both arrays and feed the rotated ORterm inputs. In this way, valuable die space is conserved by placing the PLA ORterms within the PAL array, in addition to simplifying the decode routing.

It is therefore an object of the present invention to provide a condensed single block PAL plus PLA architecture that has a smaller die size.

It is another object of the invention to provide a condensed single block PAL plus PLA architecture that utilizes simplified interconnect routing between the PAL array, PLA array and the PLA ORterms within the PAL.

It is yet a further object of the invention to provide a condensed single block PAL plus PLA architecture that has reduced propagation delay skews.

BRIEF DESCRIPTION OF THE DRAWINGS

Other objects and features of the present invention will become apparent from the following detailed description considered in connection with the accompanying drawings which disclose an embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
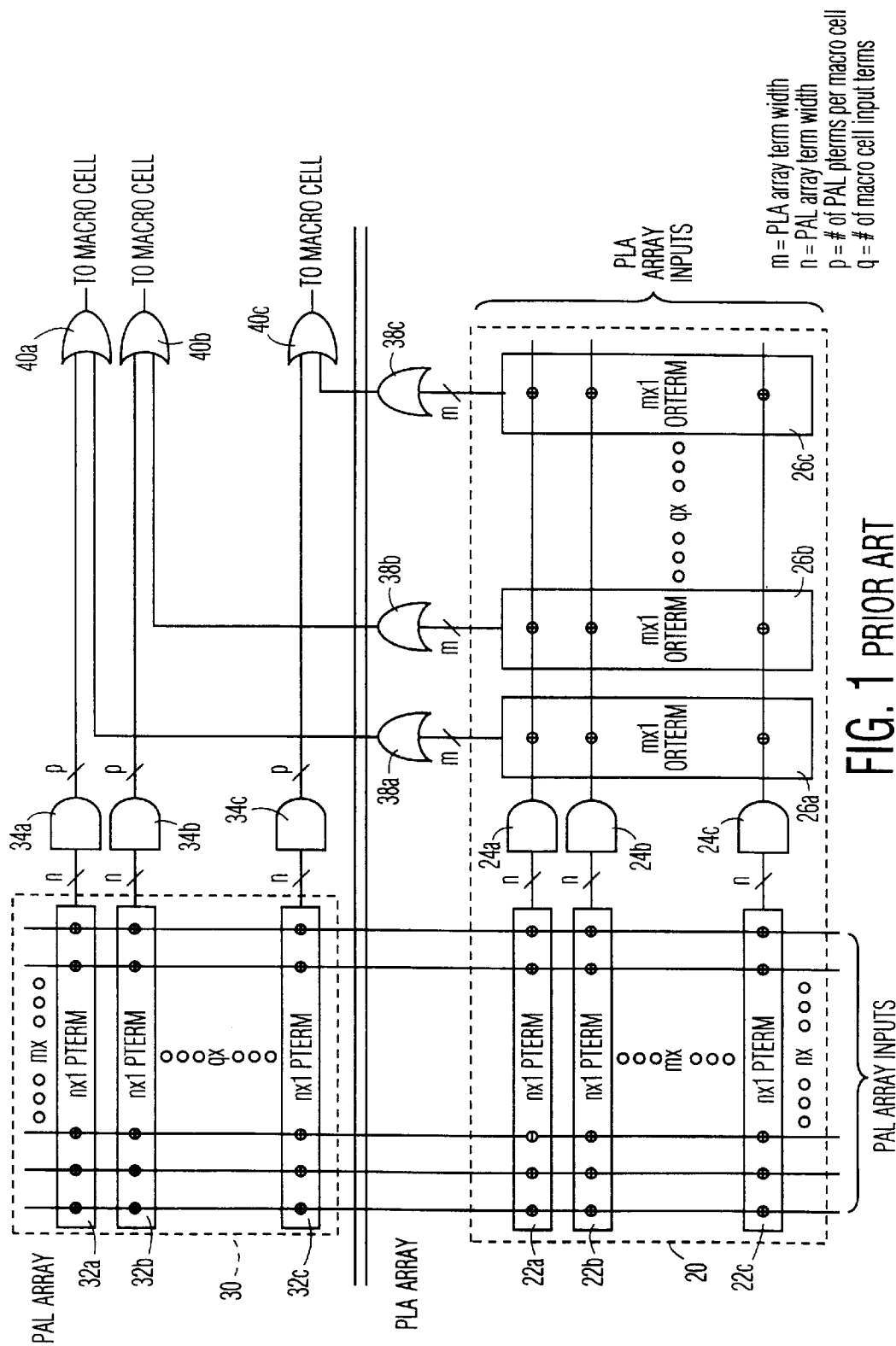
FIG. 1 is a block diagram of a PAL plus PLA architecture according to the prior art.

FIG. 1 shows a block diagram of a PAL plus PLA architecture according to the prior art. The PAL array 30 is situated above PLA array 20 in an L-shaped configuration. The PLA array 20 consists of Pterm elements 22a, 22b and 22c, arranged immediately under the Pterm elements 32a, 32b and 32c of PAL array 30. The outputs of Pterms 22a–22c are ANDed via gates 24a, 24b, and 24c, respectively, and fed into ORterms 26a, 26b, and 26c.

With the ORterms 26a–26c being arranged in this L-shaped configuration, the same basic shape results when situated on silicon, thus the efficient placement of multiple blocks of these arrays is not possible. In addition to the wasting of silicon die space, the decode routing required between the ORterms, the PLA array, and the PAL array is more complicated, and the propagation delays through the PLA path become more skewed.

Figure 2A:
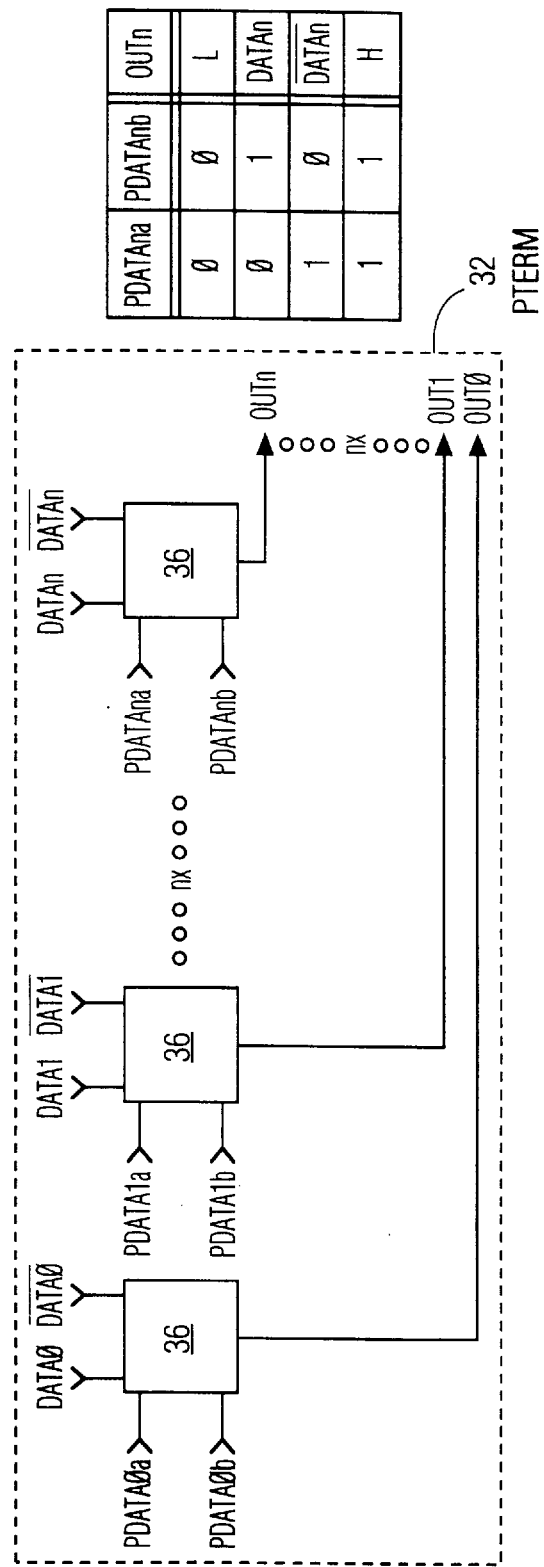
FIG. 2a is a block diagram of product-term programmable logic elements according to the invention.
Figure 2B:
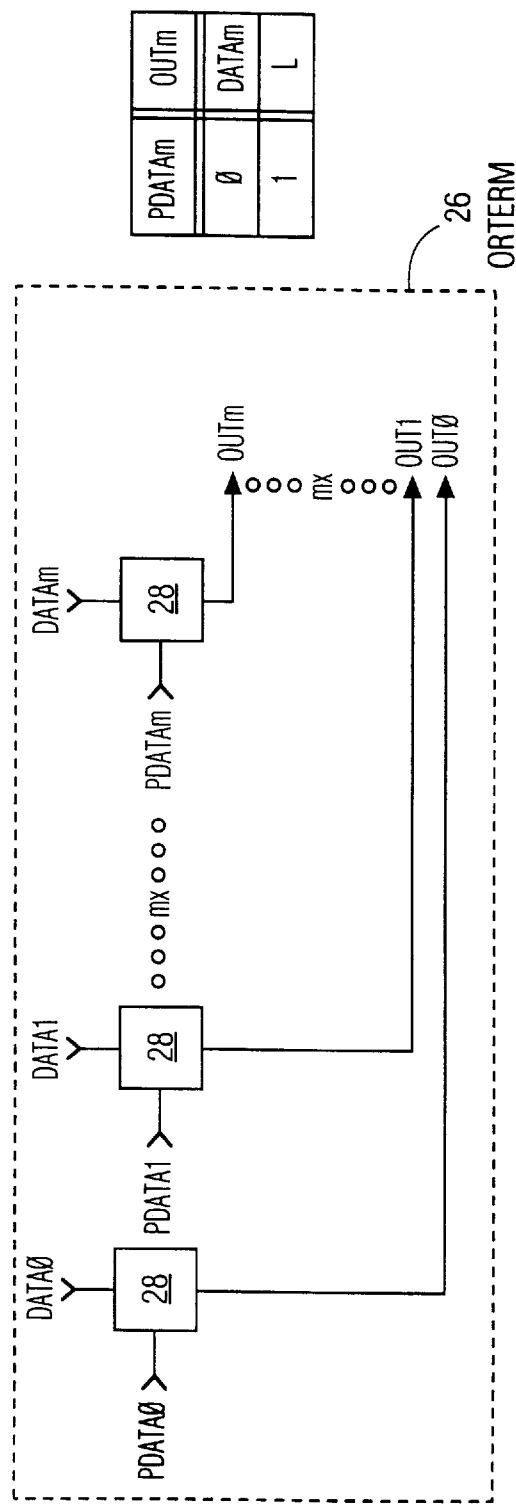
FIG. 2b a block diagram of ORterm programmable logic element according to the invention.

FIGS. 2a and 2b show block diagrams of the Product-term (Pterm) and ORterm logic elements 32 and 26, respectively. Pterm elements 32 also correspond to Pterm elements 22 in FIGS. 1 and 3. Within each of these terms exists several programmable logic blocks. For example, Pterm 32 consists of several programmable logic blocks 36, and ORterm 26 consists of several programmable logic blocks 28.

Pterms 36 each have two data inputs and two control inputs. The control inputs can also consist of memory element states. ORterms 28 each have one data input and one control input.

Figure 3:
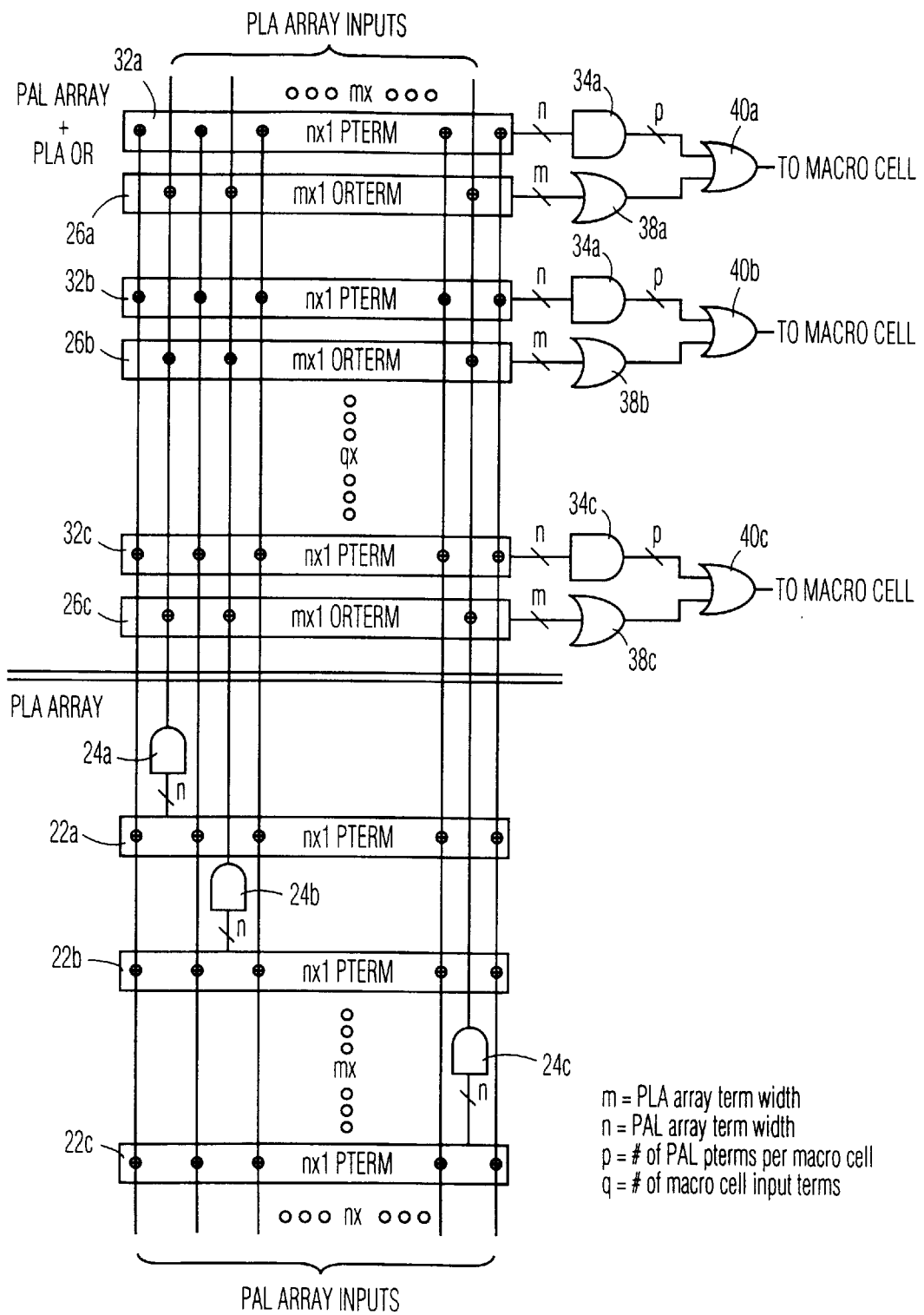
FIG. 3 is block diagram of the psquare or condensed PAL plus PLA architecture according to the invention.

FIG. 3 shows the condensed single block PAL plus PLA (PSQUARE) architecture according to the invention. In this embodiment, the ORterms 26a, 26b and 26c are evenly distributed among the Pterms of the PAL array, thereby forming the PAL array+PLA OR group. With this configuration, the AND gates 24a–24c are relocated to within the PLA array. The outputs of AND gates 24a–24c, of the Pterms 22a–22c, respectively, are fed vertically through both arrays into each of ORterms 26a–26c. Thus, the placement of the ORterms 26a–26c to the right of the PLA array is eliminated, and a significant amount of space is saved. This translates into a smaller die size needed to embody the circuit on silicon, and reduces the propagation delay skews associated with the interconnection of these elements.

The outputs of ORterms 26a–26c are fed into OR gates 38a–38c, respectively, and the outputs of the Pterms 32a–32c are fed into AND gates 34a–34c. The outputs of AND gate 34a and OR gate 38a are fed into OR gate 40a. The output of OR gate 40a feeds the macro cell being driven by this circuit. This same configuration applies for the remaining interleaved ORterms and Pterms.

By interleaving the PLA ORterms within the PAL Pterms, the outputs of the PLA array Pterms are connected vertically through both arrays to feed the rotated PLA ORterm inputs.

This configuration simplifies the decode routing needed for this application. Since the PSQUARE architecture is a rectangular array, the advent of advanced integrated circuit techniques including multiple layers of metal, all programming decode routing and inter-array interconnection issues are solved without sacrificing valuable chip area.

In an alternative embodiment of the invention (not shown), the PLA product terms can be interleaved within the PAL product terms. This accomodates even spacing of the macro cells along the entire length of PAL plus PLA array While only a single embodiment of the present invention has been shown and described, it is to be understood that many changes and modifications may be made thereunto without departing from the spirit and scope of the invention as defined in the appended claims.

What is claimed is:

1. A programmable logic device comprising
    a first array with first rows of first programmable logic blocks;
    first means for forming a respective logic AND from outputs of the first programmable logic blocks in each respective first row;
    a second array with second rows of second programmable logic blocks, the second rows running in parallel with the first rows;
    second means for forming a respective logic AND from outputs of the second programmable logic blocks in each respective second row;
    third rows of third programmable logic blocks, the third rows being located in the second array among the second rows, each third programmable logic block receiving a respective output of the first means;
    third means for forming a respective logic OR from outputs of the third programmable logic blocks in each respective third row;
    logic means for forming respective logic combinations of outputs of the second and third means.

2. A programmable logic device according to claim 1, wherein said first and second array are arranged in a rectangular area on a semiconductor die, both along a first edge of said rectangular area, the first, second and third rows running perpendicular to the first edge.

3. A programmable logic device according to claim 1, having a plurality of input lines, each coupled to a respective programmable logic block in each of the first and second rows.

4. A programmable logic device according to claim 1, comprising coupling lines between said first means and said third rows, the coupling lines running in parallel among said input lines.

5. A programmable logic device according to claim 1, wherein the second rows are organized in respective subsets, the respective logic combinations each being a logic OR of a respective output of the third means and a respective one of the subsets.

6. A programmable logic device according to claim 2, having a plurality of input lines, each coupled to a respective programmable logic block in each of the first and second rows.

7. A programmable logic device according to claim 6, comprising coupling lines between said first means and said third rows, the coupling lines running in parallel among said input lines.

8. A programmable logic device according to claim 7, wherein the second rows are organized in respective subsets, the respective logic combinations each being a logic OR of a respective output of the third means and a respective one of the subsets.

9. A programmable logic device according to claim 2, comprising coupling lines between said first means and said third rows, the coupling lines running in parallel among said input lines.

10. A programmable logic device according to claim 9, wherein the second rows are organized in respective subsets, the respective logic combinations each being a logic OR of a respective output of the third means and a respective one of the subsets.

11. A-programmable logic device according to claim 3, comprising coupling lines between said first means and-said third rows, the coupling lines running in parallel among said input lines.

12. A programmable logic device according to claim 11, wherein the second rows are organized in respective subsets, the respective logic combinations each being a logic OR of a respective output of the third means and a respective one of the subsets.

13. programmable logic device according to claim 5, comprising coupling lines between said first means and said third rows, the coupling lines running in parallel among said input lines.

14. A programmable logic device, comprising:
    a first array with first rows of first programmable logic blocks;
    first means for forming a respective logic AND from outputs of the first programmable logic blocks in each respective first row;
    a second array with second rows of second programmable logic blocks, the second rows running in parallel with the first rows;
    second means for forming a respective logic AND from outputs of the second programmable logic blocks in each respective second row;
    third rows of third programmable logic blocks, the third rows being located in the second array among the second rows, each third programmable logic block receiving a respective output of the first means;
    third means for forming a respective logic OR from outputs of the third programmable logic blocks in each respective third row;
    the respective logic functions of the first, second and third means being output in direct response to inputs provided to the first and second rows, without intervening clock cycles; and
    logic means for forming respective logic combinations of outputs of the second and third means.

* * * * *